US010056916B2

(12) United States Patent
Pernull et al.

(10) Patent No.: US 10,056,916 B2
(45) Date of Patent: Aug. 21, 2018

(54) ANALOG/DIGITAL CONVERSION WITH ANALOG FILTERING

(71) Applicant: Infineon Technologies AG, Neubiberg (DE)

(72) Inventors: Martin Pernull, Villach (AT); Peter Bogner, Wernberg (AT)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 15/675,091

(22) Filed: Aug. 11, 2017

(65) Prior Publication Data

US 2018/0083649 A1  Mar. 22, 2018

(30) Foreign Application Priority Data

Sep. 16, 2016 (DE) .................... 10 2016 117 464

(51) Int. Cl.
*H03M 1/12* (2006.01)
*H03M 3/00* (2006.01)
*G11C 27/02* (2006.01)

(52) U.S. Cl.
CPC ........... *H03M 3/368* (2013.01); *H03M 3/422* (2013.01); *H03M 3/496* (2013.01); *G11C 27/024* (2013.01)

(58) Field of Classification Search
CPC ...... H03M 3/496; H03M 3/422; G11C 27/024
USPC ................................. 341/122, 155
See application file for complete search history.

(56) References Cited

U.S. PATENT DOCUMENTS

| 7,106,231 | B2* | 9/2006 | Smith ................. | H03M 1/1028 341/120 |
| 7,333,039 | B2* | 2/2008 | Lu ....................... | H03M 1/0604 341/122 |
| 7,733,252 | B2* | 6/2010 | Nee ..................... | H01Q 3/2682 341/118 |
| 7,804,434 | B2* | 9/2010 | Stoutjesdijk ........ | G11C 27/026 341/122 |
| 7,965,218 | B2 | 6/2011 | Ohnhaeuser et al. | |
| 8,604,962 | B1* | 12/2013 | Lewyn ................ | H03M 1/0863 341/161 |
| 8,736,480 | B1 | 5/2014 | Cowley et al. | |

(Continued)

FOREIGN PATENT DOCUMENTS

DE  102008035215 A1  2/2010
DE  112014000056 T5  12/2014

OTHER PUBLICATIONS

Office Action, in the German language, from counterpart German Application No. 10 2016 117 464.5, dated Mar. 17, 017, 7 pp.

*Primary Examiner* — Brian Young
(74) *Attorney, Agent, or Firm* — Shumaker & Sieffert, P.A.

(57) ABSTRACT

A circuit (100) comprises an input terminal (141) which is configured to receive an analog input signal (142). The circuit (100) also comprises a combination element (601) which is configured to combine a number of time-displaced signal values of the input signal (142) to form an analog combination signal (144). The circuit (100) also comprises a quantizer (131) having a converter core which is configured to receive the combination signal (144) via passive charge redistribution from the combination element (601) and to convert it into a digital output signal (145). Such techniques can thus provide for an analog/digital conversion with filtering in the analog domain.

22 Claims, 10 Drawing Sheets

(56) References Cited

U.S. PATENT DOCUMENTS 9,136,857 B2 * 9/2015 Bogner ............... H03M 1/1225
2011/0043397 A1 2/2011 Carreau

* cited by examiner

ANALOG/DIGITAL CONVERSION WITH ANALOG FILTERING

TECHNICAL FIELD

Various examples relate to an analog/digital converter which is configured to perform a filtering of an input signal in the analog domain.

BACKGROUND

Analog/digital converters (ADCs) are used, for example, as integrated circuits (ICs) in various applications. For example, analog/digital converters are used for converting measurement signals into the digital domain. Frequently, the corresponding digital output signals are used as a basis for deciding about following processes. It is, therefore, typically worth the effort to perform a precise conversion of the analog input signal. This is because the integrity of the measurement or of the decision-making depends typically on the level of confidence of the conversion. Higher signal noise can lower the integrity of the measurement in this context, or of the decision-making.

Techniques are known for reducing signal in the analog/digital conversion. For example, it is known to combine a number of measurements by forming the mean value of N signal values in the digital domain and by this means to reduce especially uncorrelated signal noise. In this context, the signal noise will be typically reduced by a factor of 1/N to $\sigma^2/N$, $\sigma^2$ designating the noise variance and N being the number of averaged signal values. For example, the formation of the mean value can take place by means of a moving average filter. Such a moving average filter can be implemented in a simple manner in the digital domain by means of delay elements and adding elements. A disadvantage of such a technique is that the bandwidth of the digital output signal is reduced due to the corresponding low-pass filtering. The speed or reaction which is available for making the decision is therefore typically limited or reduced. For example, the digital output signal reflects the value of the input signal only after a delay of (N−1)T in the case of a step function in the case of an averaging of N sampling points. In this context, T designates the time between two adjacent sampling points.

In some applications—for example for analog input signals having a strong time-dependence—such a low-pass filtering can reduce the bandwidth of the digital output signal by an unacceptable amount.

Often, a decimation of the digital output signal is performed after the low-pass filter in such cases of low-pass filtering in the digital domain. This is based on the finding that the bandwidth is limited in any case due to the low-pass filtering so that, typically, no advantage can be achieved from it if the digital output signal has the same sampling frequency as the analog/digital converter. For example, the frequency of the digital output signal could be reduced from 1/T to a value of 1/(N×T). For such a case, no delay can be observed in the example, described above, of the step function at the analog input signal; this is the case since the entire system has an operation which corresponds to that of an analog/digital converter which operates with a lower sampling frequency. The reduction achieved in the signal noise is still $\alpha^2/N$ but the sampling rate originally used at the analog/digital converter is not available at the output. Such an approach is, therefore, comparatively inefficient with respect to the processing speed and power consumption.

In order to avoid aliasing effects, it may typically be additionally necessary to perform a bandwidth limiting of the analog input signals in the analog domain by means of an analog filter. Alternatively, sampling frequencies with a random scheme, for example by additive random sampling, jitter, etc. can be applied in order to avoid the aliasing, effect. Such techniques, in turn, exhibit the restriction of a not mandatory deterministic sequence and complicated signal processing.

SUMMARY

There is therefore a need for improved techniques of analog/digital conversion. In particular, there is a need for such techniques which reduce or eliminate at least some of the abovementioned disadvantages and restrictions.

This object is achieved by the features of the independent patent claims. The dependent patent claims define embodiments.

In one example, a circuit comprises an input terminal which is configured to receive an analog input signal. The circuit also comprises a combination element which is configured to combine a number of time-displaced signal values of the input signal to form an analog, combination signal. The circuit also comprises a quantizer having a converter core. The converter core is configured to receive the combination signal via passive charge redistribution from the combination element and to convert it into a digital output signal. For example, it would be possible in some examples that the analog low-pass filter is a discrete-time analog low-pass filter.

In a further example, an ADC comprises an input terminal which is configured to receive an analog input signal. The ADC also comprises an analog low-pass filter which is configured to filter the input signal for obtaining a filtered signal. The ADC also comprises a converter core which is configured to receive the filtered signal from the lowpass filter and to convert it into a digital output signal. The analog low-pass filter forms an input stage of the converter core. For example, it would be possible in some examples that the analog low-pass filter is a discrete-time analog low-pass filter.

In a further example, a method comprises the receiving of an analog input signal. The method also comprises the combining of different signal values of the input signal for obtaining an analog combination signal. The method also comprises the transmitting of the combination signal by passive charge redistribution and converting the combination signal into a digital output signal.

In a further example, a method comprises the receiving of an analog input signal. The method also comprises the filtering of the input signal by means of an analog low-pass filter in order to obtain a filtered signal. The method also comprises the receiving of the filtered signal from the low-pass filter and the converting of the received, filtered signal into a digital output signal. The low-pass filter forms the input stage of the converter core.

The features presented above and features which will be described in the text which follows can be used not only in the corresponding combinations presented explicitly but also in other combinations or on their own without departing from the scope of protection of the present invention.

DETAILED DESCRIPTION OF EMBODIMENTS

Figure 1:
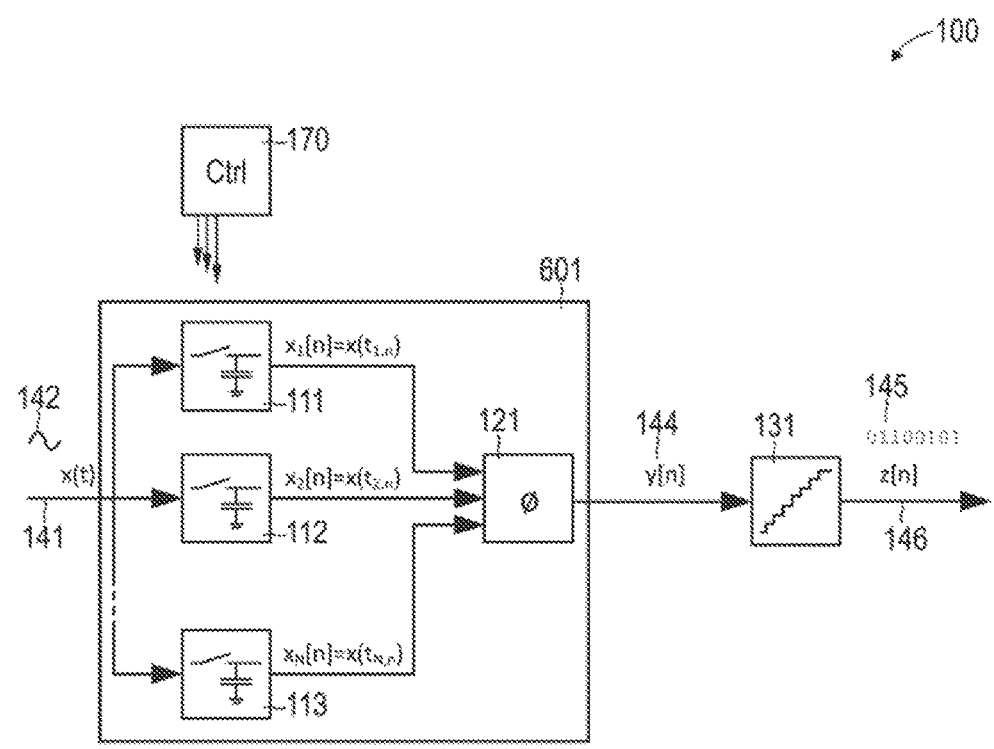
FIG. 1 diagrammatically illustrates a circuit according to various embodiments which comprises a combination element which is configured to combine a number of time-displaced signal values of an analog input signal to form an analog combination signal.

The characteristics, features and advantages of this invention described above and the manner in which these are achieved will become clearer and more distinctly comprehensible in conjunction with the following description of the illustrative embodiments which are explained in greater detail in conjunction with the drawings.

In the text which follows, the present invention will be explained in greater detail by means of preferred embodiments with reference to the drawings. In the figures, identical reference symbols designate identical or similar elements. The figures are diagrammatic representations of various embodiments of the invention. Elements shown in the figures are not necessarily shown true to scale. Instead, the various elements shown in the figures are reproduced in such a manner that their operation and general purpose becomes comprehensible to the expert. Connections and couplings shown in the figures, between functional units and elements can also be implemented as indirect connection or coupling. A connection or coupling can be implemented in wire-connected or wireless manner. Functional units can be implemented as hardware, software or a combination of hardware and software.

In the text which follows, techniques for analog/digital conversion (A/D conversion) are described. In various examples, ADCs are then used which, for example, operate in accordance with toe successive approximation register (SAR) method. However, the corresponding techniques can also be transferred to other ADCs which, for example, are based on the delta/sigma method. For a description of various examples, reference is primarily made in the text which follows to ADCs which work in accordance with the SAR method. The corresponding techniques can also be transferred to other ADCs, however.

The techniques described can be used in various fields of application. For example, the A/D conversion can be used in conjunction with measuring techniques in which an analog input signal is received via one sensor or a number of input signals are received by a number of sensors. The input signals are then typically indicative of a physical observable. For example, the A/D conversion can be used in conjunction with microphones which, for example, map ambient noises in the analog input signal based on a pressure sensor.

In some examples, a filtering of the analog input signal is performed even before the A/D conversion. The filtering can therefore be performed in the analog domain. The filtering can correspond, for example, to a low-pass filter. E.g., the filtering can be time-discrete. For example, the filtering can be implemented by the combination of a number of time-displaced signal values or, in particular, by forming mean values. For example, it would be possible that a number of different signal values are combined to form one analog combination signal. The time-displaced signal values can then correspond, for example, to various sample points or sample time points. To receive the different signal values, sample-and-hold elements can be used, for example, which are configured to sample and hold the several signal values of the analog input signal.

In various examples, it may be possible, in particular, to implement corresponding techniques in a particularly hardware-efficient manner. For this purpose, it can be possible, for example, to reuse particular hardware components which are normally present in any case in an ADC, for the analog filtering. The analog filtering can thus be implemented as part of the ADC. E.g., the analog filter can form the input stage of the converter core of the ADC.

In one example, a sampling capacitor of the ADC can be used, for example, for implementing the sample-and-hold elements. In a further example, a number of DAC capacitors which form the input stage of a converter core of an SAR ADC, for example, can be used for implementing the sample-and-hold elements and the combination of the time-displaced signal values.

As a result, the combination signal can be transmitted to the converter core via passive charge redistribution. Passive charge redistribution can be achieved, e.g., without providing an active component, for example an operational amplifier, etc. This means that, for example, the corresponding current flow does not have to flow through active components. Passive charge distribution can correspond, e.g., to the matching of the charges to different capacitors: As a result, a finite charge quantity different from the mitral state may be present at the different capacitors after the charge redistribution. Passive charge redistribution can be achieved, e.g., without imposing a potential difference by an external voltage source or an external current source: the potent al difference effected by the passive charge redistribution may be due, e.g., to a charge carrier density gradient between capacitors of the various sample-and-hold elements.

By means of such techniques, various effects can be achieved:

(i) For example, it can be avoided that a comparatively strong reduction of the bandwidth is observed at the digital output signal, for example in comparison with the techniques described initially in which a filtering is performed in the digital domain. This can be achieved by a particularly fast combination of the time-displaced signal values in the analog domain.

(ii) Furthermore, it may be possible that the power consumption is reduced, for example again in comparison with the techniques described initially in which a filtering is performed in the digital domain. This can be achieved, e.g., by stepping down before the A/D conversion. In addition, multiplex techniques can be implemented for better balancing of the converter core by converting a number of input signals. In addition, a filtering in the digital domain may be omitted.

In addition, it may be possible to implement the filter elements in the analog domain in a particularly space-saving and highly integrated manner. In various examples, hardware of the ADCs, present in any case, can be used again. For example, a sampling capacitor or DAC capacitors of an input stage of a converter core of a SAP ADC can be used again for filtering.

(iv) Particularly flexible sampling schemes can also be used. E.g., random sampling arrangements can be used.

(v) In general, the techniques described herein provide for a precise A/D conversion, the signal noise of which is comparatively limited.

From the above, it can be seen that various effects can be achieved.

FIG. 1 illustrates aspects with respect to a circuit 100 which can perform an A/D conversion of an analog input signal 142 which is received via an input terminal 141, into a digital output signal 145 which is output via an output terminal 146. The circuit 100 thus implements an ADC. In particular, FIG. 1 illustrates aspects with respect to a filtering of the analog input signal 142 in the analog domain, i.e. before the quantizer 131 of the ADC.

In FIG. 1, a combination element 601 comprises a number of parallel-connected sample-and-hold elements 111-113. The combination element 601 is configured to combine a number of time-displaced signal values of the input signal 142 to form an analog combination signal 144. For this purpose, an adder stage 121 is provided which is arranged between the sample-and-hold elements 111-113 and the quantizer 131. The adder stage 121 is configured to combine the signal values of the input signals sampled and held by the sample-and-hold elements 111-113 at different times. For example, the adder stage 121 can be configured to form a mean value or average of the signal values of the input signal sampled and held by the sample-and-hold elements 111-113 at different times.

In the example of FIG. 1, the sample-hold-element usually present as input stage of the quantizer 131 in any case, with sampling capacitor, is replaced by a number of sample-and-hold elements which can be operated individually. The conventional sampling capacitor is replaced by a number of capacitors which can be activated individually.

By means of the number of sample-and-hold elements 111-113, it is then possible to sample a number of time-displaced signal values. To establish the times at which the signal values are sampled, a so-called sampling scheme can be used. The sampling scheme can be predetermined permanently, for example in a memory. The sampling scheme could also have random or pseudo-random components. For implementing the sampling scheme, there is a controller 170 which drives the sample-and-hold elements 111-113.

In the example of FIG. it is possible, in particular, that the signal values, held by the sample-and-hold elements 111-113 of the combination element 601, of the input signal 142 are transmitted by passive charge redistribution from the combination element 601 to the quantizer 131. The combination element 601 takes over the functionality of the sample-hold-element of the quantizer 131 normally present. Since the combination signal 144 can be transferred by passive charge redistribution to the quantizer 131, a particularly simple hardware architecture can be used. In particular, it can be superfluous to keep available active components such as, for example, an operational amplifier.

Whilst a number of three sample-and-hold elements 111-113 is shown in the implementation of the circuit 100 according to FIG. 1, it may be possible in other implementations to use a greater or smaller number of sample-and-hold elements.

Figure 2:
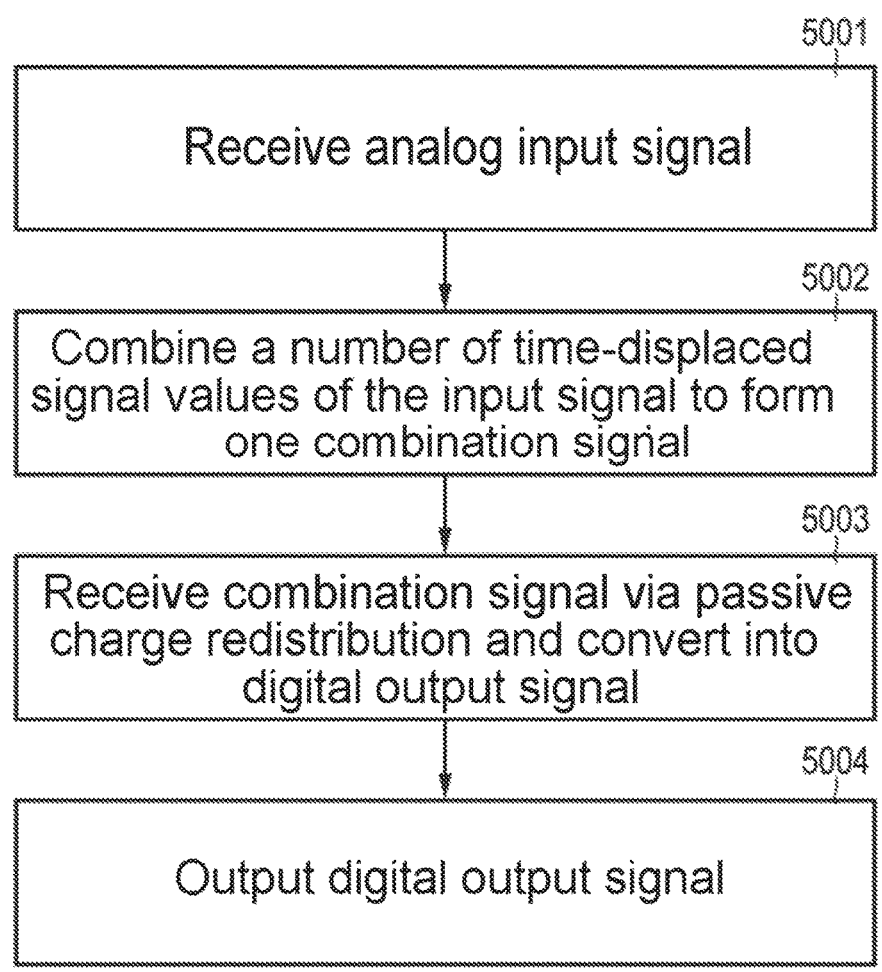
FIG. 2 is a flowchart of a method according to various embodiments.

FIG. 2 is a flowchart of a method according to various embodiments. FIG. 2 illustrates aspects with respect to the operation of the circuit 100 according to FIG. 1.

Initially, an analog input signal is received in block 5001. In various examples, more than a single input signal, for example from different sensors, could also be received.

In block 5002, a combination of a number of signal values of the input signal to form an analog combination signal is then performed. For this purpose, for example, sample-and-hold elements could be provided which are configured to sample, and subsequently to hold the number of signal values of the input signals at different times.

If a number of input signals are received, it is possible that block 5002 is executed in each case for each received input signal.

In block 5003, the combination signal from block 5002 is received by passive charge redistribution, for example by the converter core, for instance a comparator, of the quantizer. Then the combination signal is converted into a digital output signal. The digital output signal is therefore indicative of the analog input signal.

In various examples, a gain factor of the converter can be set by a suitable modification of the block 5003. This is optional.

Following this, the digital output signal can be output via an output terminal optionally in block 5004. For example, the digital output signal could be output to a processor for further data analysis.

Figure 3:
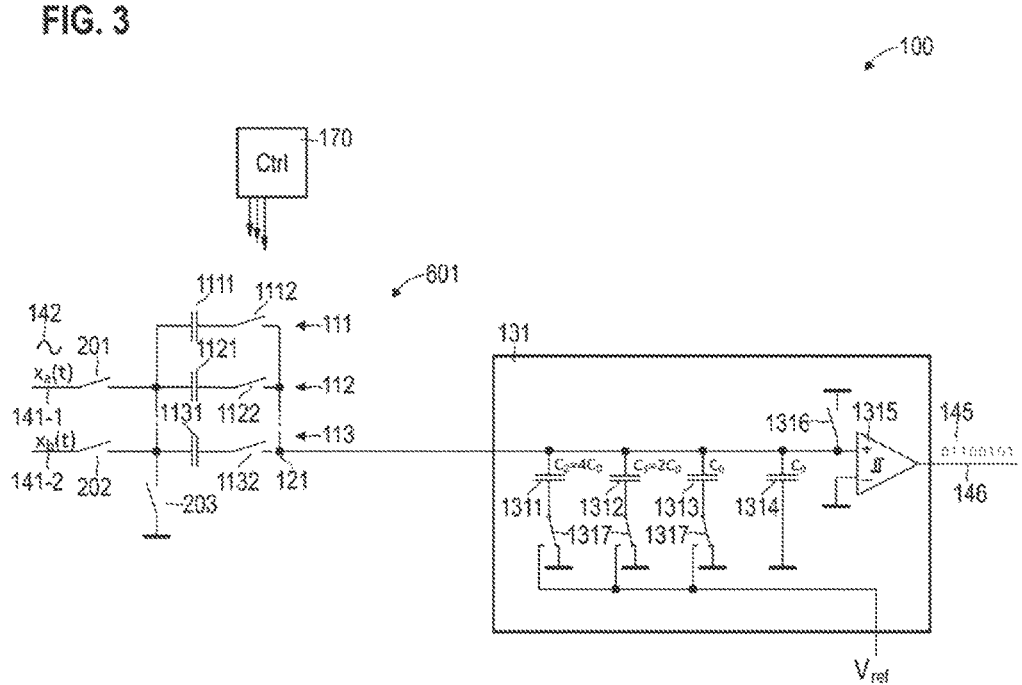
FIG. 3 diagrammatically illustrates a possible implementation of the circuit of FIG. 1 according to various embodiments.

FIG. 3 illustrates aspects with respect to the circuit 100. FIG. 3 illustrates, in particular, an exemplary hardware implementation of the circuit 100 according to FIG. 1. FIG. illustrates aspects with respect to an exemplary hardware implementation of the circuit 100 in which the combination element 601 is formed by a sampling input stage of the quantizer 131.

In FIG. 3, a scenario is shown in which the circuit comprises a number of input terminals 141-1, 141-2. In each case a switch 201, 202 is allocated to the two input terminals 141-1, 141-2. Following this, a scenario is described, for reasons of simplicity, in which the switch 202 is permanently open, that is to say non-conducting, so that no corresponding input signal is received via the input terminal 141-2. In other examples, it could be possible to switch to and fro between the input terminals 141-1, 141-2 by means of time multiplexing for example.

In FIG. 3, a scenario is shown in which the sample-and-hold elements 111-113 comprise in each case a capacitor 1111, 1121, 1131, and an associated switch 1112, 1122, 1132.

The circuit 100 also comprises the controller 170. For example, the controller 170 could be implemented by a microprocessor or a microcontroller. The controller 170 is configured to open and to close (operate) the switches 1112, 1122, 1132 optionally. In this context, the various switches 1112, 1122, 1132 could be operated in each case separately or individually, respectively. In particular, different switches 1112, 1122, 1132 can be operated in each case separately or individually, respectively. In particular, different switches 1112, 1122, 1132 can be operated at different times or at the same time.

For sampling the signal values of the input signal 142, it can be possible that the controller 170 initially closes the switches 1112, 1122, 1132. Switch 203 is opened. Switch 201 is closed. Switch 1316 is closed.

Then follows the charging stored in the capacitors after a settling period limited by a finite rate of increase of the charging—the generally time-variable signal value of the input signal 142. At the same time, the sample-and-hold elements 111-113 are decoupled from the quantizer 131.

At certain points in time—e.g. defined by means of a sampling scheme—the signal values are sampled by the respective opening of the associated switches 1112, 1122, 1132 and subsequently held. Switch 201 remains closed until all sample-and-hold elements 111-113 have sampled one signal value.

When all switches 1112, 1122, 1132 are holding correspondingly time-displaced signal values, the combination of these signal values can be performed. For this purpose, the switches 201 and 1316 are opened (if not yet done) and subsequently, switches 1112, 1122, 1132 are operated time-overlapped by the controller 170 in the closed state. By this means, the charge is distributed between the corresponding capacitors 1111, 1121, 1131. A first passive charge redistribution takes place. In order to prevent a run-off of the charge to ground, switch 203 is opened.

In an example in which all capacitors 1111, 1121, 1131 have the same capacitance, the same charge is stored at all capacitors 1111, 1121, 1131 following the combining. In an example in which the capacitors 1111, 1121, 1131 have different capacitances, a different charge is stored subsequently in different capacitors, namely corresponding to a weighting based on the capacitances.

The combination signal is thus obtained as:

$$y[n] = \frac{1}{\sum_{i=1}^{N} C_i} \cdot \sum_{i=1}^{N} C_i \cdot x_i[n], \quad (1)$$

wherein $C_i$ designates the capacitances of capacitors 1111, 1121, 1131, and $x_i[n]$ designates the respective signal value. i indicates the altogether N different sample-and-hold elements 111-113.

For identical capacitances $C_i$, equation (1) is simplified to the arithmetic mean:

$$y[n] = \frac{1}{N} \cdot \sum_{i=1}^{N} x_i[n]. \quad (2)$$

This corresponds to a low-pass filter.

In the example of FIG. 3, the adder element 121—which, for example, implements the formation of a mean value i.e. by connecting capacitors 1111, 1121, 1131 in parallel. This means that the combination operation in the analog domain can be implemented in a particularly simple manner. In particular, a combination of the time-displaced signal values stored by the various capacitors 1111, 1121, 1131 can be achieved by connecting them in parallel. This can allow particularly rapid and energy-efficient combining.

In order to achieve the passive charge redistribution from the combination element 601 to the quantizer 131, switch 203 is closed: By this means, the capacitors 1111, 1121, 1131 are related to the same reference potential as the capacitors 1311-1314 of the quantizer 131, see switch 1317. By closing the switches 1112, 1122, 1132, the charge of the capacitors 1111, 1121, 1131 can flow off at least partially from the capacitors 1311-1314: In this manner, the second passive charge redistribution takes place. Switch 661 remains open. In particular, a charge compensation can take place. This may mean that a residual charge can be retained in the capacitors 1111, 1121, 1131.

In the example of FIG. 3, the quantizer operates in accordance with the successive approximation register method. This means that the quantizer 131 converts the combination signal 144 after its transmission to the capacitors 1311-1314 in accordance with the successive approximation register method into the digital output signal 145. Sometimes, an arrangement of the capacitors 1311-1314 is also designated as top-plate sampling chain. In this context, the capacitors 1311-1314 and the switches 1317 are normally used as input stage to the converter core 1315 which, in the example of FIG. 3, is implemented via a comparator. E.g., the input stage can implement a digital-analog converter for a feedback signal. The switches 1317 are subsequently activated serially by a corresponding SAR logic so that the various positions of digital output signal 145 are gradually determined by the comparator 1315.

In one example, it is possible that the controller 170 is configured for activating all switches 1112, 1122, 1132 of the sample-and-hold elements 111-113 of the combination element 601 overlapping in time in such a manner that the entire charge stored in the capacitors 1111, 1121, 1131 is transferred to the quantizer 131 as the combination signal 144. In such an example, the combination signal 144 has a particularly large amplitude so that a gain factor assumes large values and typically the signal/noise ratio is also large.

In other examples, how-ever, it may be worthwhile to design the gain factor to be selectable or variable. In such an example, the controller 170 can only select a subset of the switches 1112, 1122, 1132 of the sample-and-hold elements 111-113 and then selectively close the switches 1112, 1122, 1132 of this subset. By this means, a fraction of the charge of all capacitors 1111, 1121, 1132 is transferred as combination signal 144 to the converter core 1315. Such a selectable gain factor may be worthwhile particularly in conjunction with different input signals which have different signal levels. For example, it would be possible that the controller 170 determines a different gain factor depending on the operating mode. In this context, for example, the operating mode can depend on the input terminal 141-1, 141-2 activated in accordance with the position of the switches 201, 202, for example in a time division multiplexing technology. By this means, a matching of the levels of the output signal 145 can be achieved.

If, according to the above explanation, the charge of individual capacitors 1111, 1121, 1131 is not transferred to the quantizer 131 by charge redistribution, it would be possible that the corresponding sample-and-hold elements 111-113 participate in the sampling of the input signal 142 but do not participate in the sampling of the input signal 142, i.e. do not store a corresponding signal value of the input signal 142. If one or more sample-and-hold elements 111-113 do not participate in the sampling of the input signal 142, the number of signal values and thus the accuracy of the averaging would be reduced but, at the same time, a smaller quantity of charge would be removed from the input terminal 141-1. By this means, a particularly rapid sampling can be obtained since a particularly rapid rate of increase can be achieved. The settling process is quickly ended. For example, the rate of increase can be limited by the quantity of charge per time provided by an impedance converter at the input terminal 141-1.

Whilst a number of three sample-and-hold elements 111-113 is presented in the implementation of the circuit 100 according to FIG. 3, it is possible in other implementations to use a greater or lesser number of sample-and-hold elements. In this context, it may be required in each case that the corresponding sample-hold-element 111-113 has a switch for separation with respect to the quantizer 131.

Figure 4:
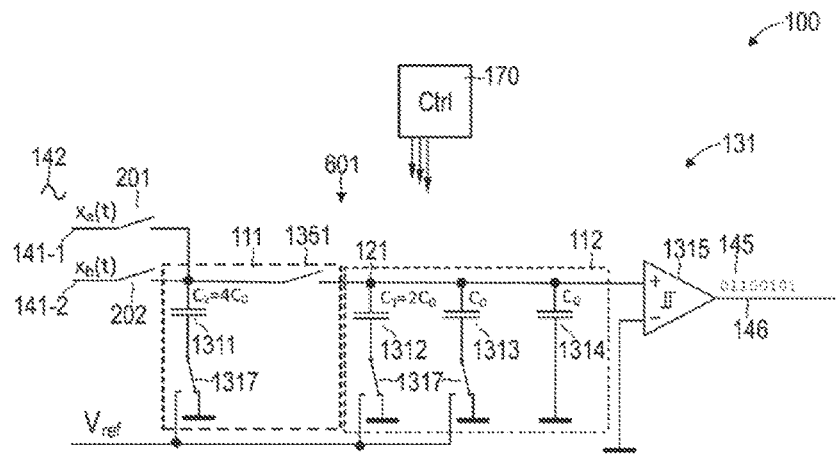
FIG. 4 diagrammatically illustrates a possible implementation of the circuit of FIG. 1 according to various embodiments.

FIG. 4 illustrates aspects with respect to the circuit 100. FIG. 4 illustrates, in particular, an exemplary hardware implementation of the circuit 100 of FIG. 1. The implementation of FIG. 4, in principle, corresponds to the implementation of FIG. 3: In this context, however, the combination element. 601 is formed by the DAC capacitors 1311-1314 of the quantizer 131. This means that the DAC capacitors 1311-1314—which can be activated serially by the controller 170 for the A/D conversion according to the successive approximation register method—and the associated switches form the sample-and-hold elements 111, 112. An arrangement of the capacitors 1311-1313 is sometimes also called top-plate sampling chain. In this context, the reference is provided by the switch 1317 during the sampling.

In the example of FIG. 4, a switch 1351 is provided which is arranged in the signal path from the input terminal 141-1 to the converter core 1315 and between adjacent capacitors 1311, 1312. By means of switch 1351, time-displaced signal values of the input signal 142 can be sampled again.

In the example of FIG. 4, the sample-and-hold elements 111, 112 thus branch away from the signal path from the input terminal 141-1, 141-2 towards the quantizer, namely to ground or to a reference potential, respectively.

In the example of FIG. 4, the capacitances of the sample-and-hold elements 111, 112 are equally' dimensioned; but differently dimensioned capacitances would also be possible.

In the example of FIG. 4, too, the controller 170 is configured to combine the number of time-displaced signal values of the input signal by closing the switch 1351 for passive charge redistribution between the capacitors 1311-1314.

In the example of FIG. 4, only two time-displaced signal values of the input signal 142 can be sampled and held, and subsequently combined, by providing the switch 1351. However, it would also be possible to provide a greater number of switches and correspondingly to implement more sample-and-hold elements.

Firstly, switches 1317 are connected to ground and the switch 1351 and one of the switches 201 are closed or in a conducting state. Capacitors 1311-1314 follow the input signal 142-1 or 142-2, depending on which one of switches 201 is closed. By opening switch 1351, the respective input signal 142 is sampled at the time of opening by the sample-hold-element 112. For a period of time, the respective switch 201 remains closed after which it is opened. By this means, the respective input signal 142 is sampled by the sample-hold-element 111, this time at the time of opening, of switch 201. Switch 201 is then left open while switch 1351 is closed. If the samples differ, a passive charge redistribution occurs in that a charge flows from the capacitors charged more to the capacitors charged less. In other words, a combination of the time-displaced signal values of the sample-and-hold elements 111, 112 occurs by closing the switch 1351 and holding the switch 201 in the opened state.

Subsequently, the A/D conversion takes place in accordance with the successive approximation register. For this purpose, the switches 1317 are serially activated and connect the respective capacitors 1311-1313 to ground or to the reference voltage. In each case, a single bit of the digital output. signal 145 is determined by the comparator 1315.

Figure 5:
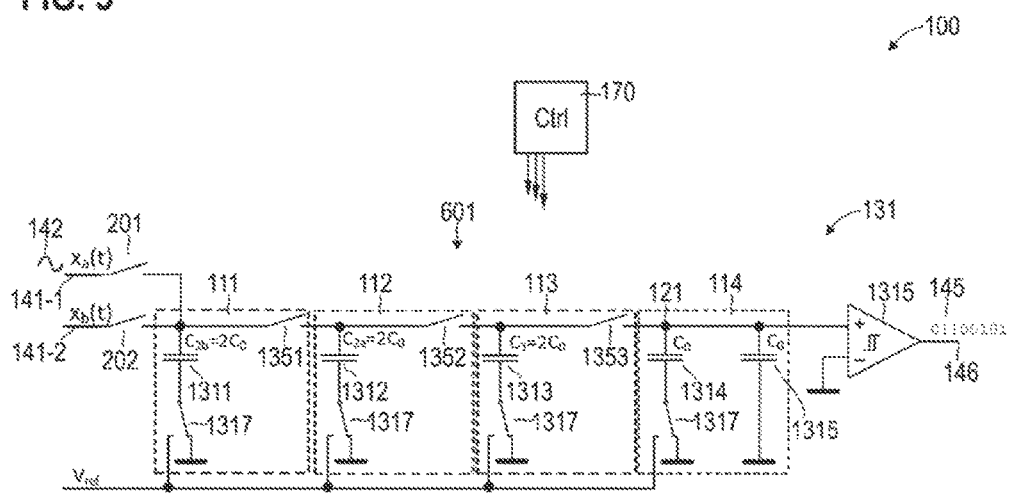
FIG. 5 diagrammatically illustrates a possible implementation of the circuit of FIG. 1 according, to various embodiments.

FIG. 5 illustrates aspects with respect to the circuit 100. FIG. 5 illustrates, in particular, an exemplary hardware implementation of the circuit 100 of FIG. 1. The implementation of FIG. 5 basically' corresponds to the implementation of FIG. 4. However, a greater number of sample-and-hold elements 111-114 is provided, a number of switches 1351-1353 being provided again in the signal path between the input terminal 141-1 and converter core 1315 and between adjacent capacitors 1311-1314. An arrangement of the capacitors 1311-1313 is sometimes also called top-plate sampling chain.

Figure 6:
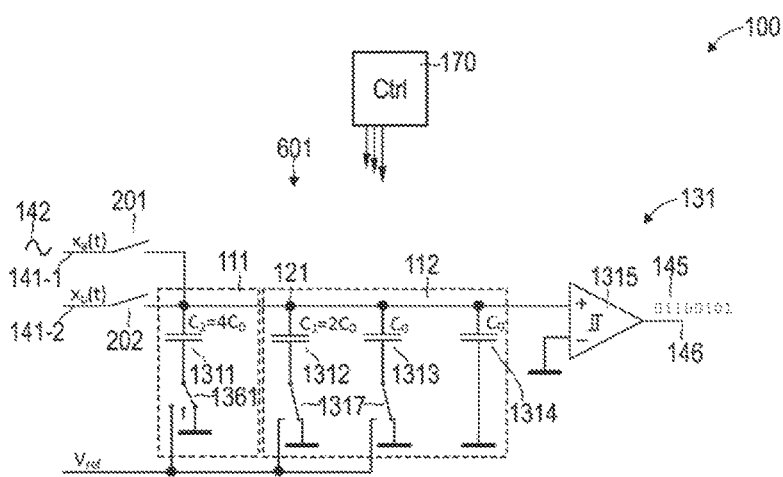
FIG. 6 diagrammatically illustrates a possible implementation of the circuit of FIG. 1 according to various embodiments.

FIG. 6 illustrates aspects with respect to the circuit. FIG. 6 illustrates, in particular, an exemplary hardware implementation of the circuit 100 of FIG. 1. The implementation of the circuit 100 in FIG. 6 here basically corresponds to the implementation of circuit 100 in FIG. 4. FIG. 6 however shows an implementation in which the switch 1351 has been replaced by the 3-way switch 1361. The switch 1361 of the sample-hold-element 111 here optionally connects capacitor 1111 to ground, a reference potential and a floating potential (center position of the switch 1361 in the illustration of FIG. 6). Arrangement of the capacitors 1311-1313 is sometimes also called top-plate sampling chain.

In the implementation of FIG. 6, switches 1361, and switches 1317 are initially connected to ground. With a closed switch. 201, capacitors 1311-1314 then follow the input signal 142. Subsequently, the controller 170 controls the switch 1361 so that it connects the capacitor 1311 to the floating potential. This corresponds to the sampling of the signal value of the input signal 142 at the corresponding time point through the sample-hold-element 111. Capacitors 1312-1313 still follow the input signal 142 up to the time at which the switch 201 is opened: the corresponding signal value of the input signal 142 is them sampled by the sample-hold element 112.

The combination of the time-displaced signal values which can be stored by the capacitors 1311 or 1312-1113, respectively, can take place again by controlling the switch 1361 in such a manner that it connects the capacitor 1311 to ground, the switch 201 remaining in the opened, i.e. non-conducting state, at the same time.

Subsequently, the A/D conversion can be performed again in accordance with the SAR process.

Figure 7:
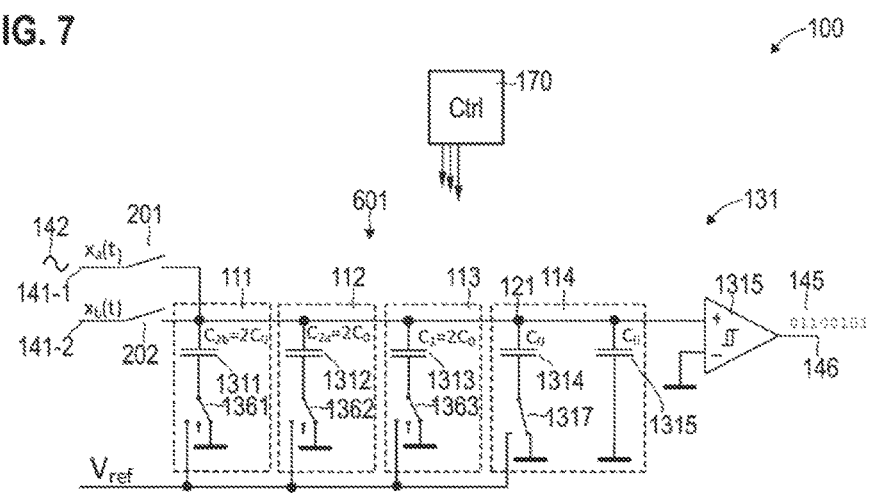
FIG. 7 diagrammatically illustrates a possible implementation of the circuit of FIG. 1 according to various embodiments.

FIG. 7 illustrates aspects with respect to circuit 100. FIG. 7 illustrates, in particular an exemplary hardware implementation of the circuit 100 of FIG. 1. The implementation of FIG. 7 here corresponds basically to the implementation of FIG. 6. However, a greater number of sample-and-hold elements 111-114 is provided, 3-way switches 1361-1363 being provided again which optionally connect the respective capacitor 1311-1313 to ground, a reference potential and a floating potential. An arrangement of the capacitors 1311-1313 is sometimes also called top-plate sampling chain.

In examples of FIGS. 4-7, it would be possible, for example, to implement a selectable gain factor in that following the combination of the signal values, certain capacitors 1311-1314 being discharged by a charge redistribution between the various capacitors 1311-1314.

Figure 8:
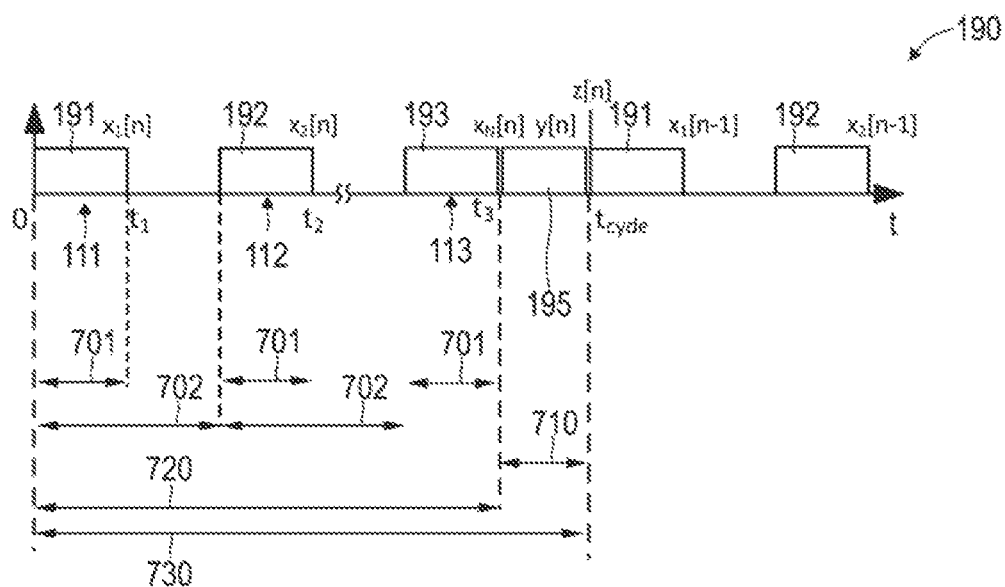
FIG. 8 diagrammatically illustrates a sampling, arrangement by means of which the time-displaced signal values of the input signal are sampled according to various embodiments.

FIG. 8 illustrates aspects with respect to a sampling scheme 190. FIG. 8 shows the variation over time of the operation of the various sample-and-hold elements 111-113.

At a time T1, the signal value 191 is sampled by the sample-hold-element 111 and then held. For this purpose, the sample-hold-element 111 follows the input signal 142, for example during a period 701. Time T1 here corresponds, for example, to the time at which the switch 1112 is opened in accordance with the example of the circuit 100 in FIG. 3.

At a time 12, the signal value 192 is sampled by the sample-hold element 112 and subsequently held. For this purpose, the sample-hold-element 112 follows the input signal 142, for example during a period of time 701. Time 12 here corresponds, for example, to the time at which the switch 1122 is opened in accordance with the example of the circuit 100 in FIG. 3.

At a time 13, the signal value 193 is sampled by the sample-hold-element 113 and subsequently held. For this purpose, the sample-hold-element 113 follows the input signal 142, for example during a period of time 701. Time T3 here corresponds, for example, to the time at which, according to the example of the circuit 100 in FIG. 3, the switch 1132 is opened. The corresponding charge redistribution corresponds to the formation of a mean value.

Following the sampling of the signal values 191-193, converting occurs by the quantizer 131. In FIG. 8, a corresponding conversion period 710 is shown.

From FIG. 8, it can be seen that the time intervals 702 between successive times which correspond to the various signal values, correspond to one another. This means that the controller 170 is configured to activate the combination element 601 in such a manner that the several signal values are arranged at regular times. Identical sampling intervals 702 are obtained.

In FIG. 8, a period of time 720 is also illustrated which is needed for sampling the various signal values. In the example of FIG. 8, this period of time 720 between the time corresponding to the first sampled signal value 191 and the last sampled signal value 193 is longer than the conversion period 710 for converting the combination signal 144 into the output signal 145. In other examples, however, it would also be possible that the period of time 720 is shorter than the conversion period 710.

In FIG. 8, a period of time 730 of the iteration is also shown which corresponds to the clocking of the quantizer 131 with respect to the input signal 142.

In the example of FIG. 8, the clock rate of the input signal 142 is reduced before the quantizer 131. For this reason, it may be possible that the quantizer 131 performs the A/D conversion. 195 with the low clock frequency corresponding to the period of time 730. This may provide for a reduced power consumption of the quantizer 131 or of the converter core 1315, respectively, particularly in comparison with reference implementations in which averaging takes place in the digital domain, i.e. following the quantizer 131. In addition, no additional energy consumption is needed by the formation of mean values in the digital domain.

Figure 9:
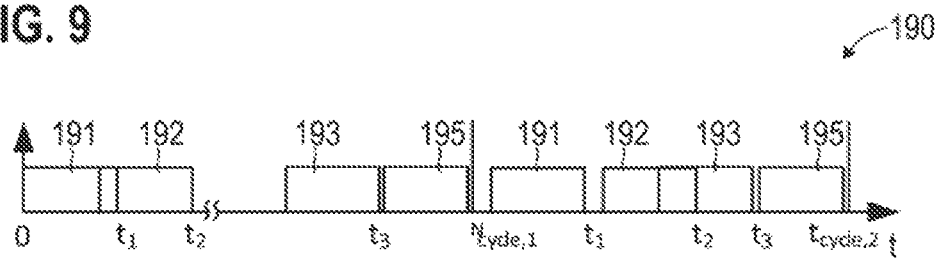
FIG. 9 diagrammatically illustrates a sampling arrangement by means of which the time-displaced signal values of the input signal are sampled according to various embodiments.

FIG. 9 illustrates aspects with respect to a sampling scheme 190. In FIG. 9, the variation over time of the operation of the various sample-and-hold elements 111-113 is shown.

The sampling scheme 190 according to FIG. 9 here basically corresponds to the sampling scheme 190 according to FIG. 8. In this context, however, the controller 170 in the example of FIG. 8 is configured to activate the combination element 601 in such a manner that the signal values 191-193 are arranged at random times. For example, pseudorandom sequences can be used for determining the sampling scheme 190. However, other techniques can also be used for generating a random sequence.

For example, an implementation of a random sampling scheme 190 according to the example of FIG. 9 in combination with the formation of mean values or low-pass filtering can exhibit advantages with respect to the bandwidth limitation. For example, a disturbance can be uncorrelated with respect to the sampling scheme 190. This means that the disturbance can be filtered.

Figure 10:
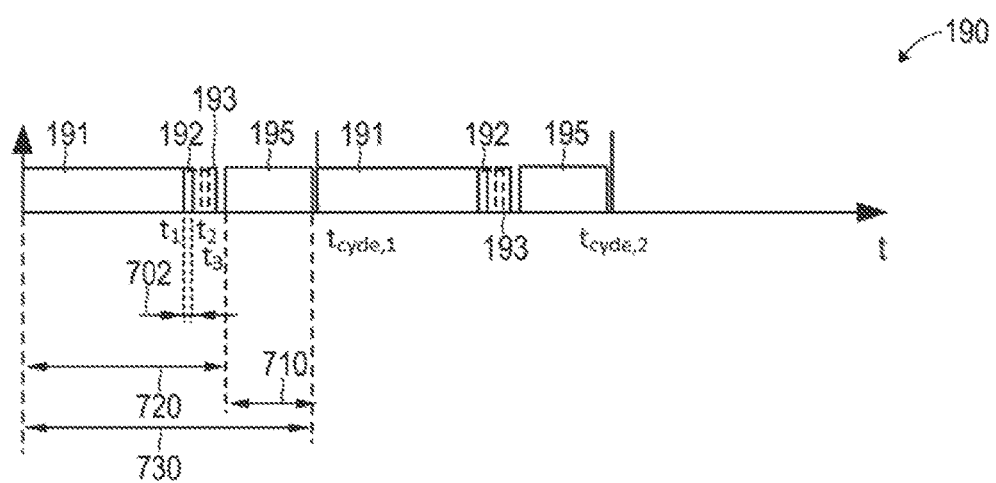
FIG. 10 diagrammatically illustrates a sampling arrangement, by means of which the time-displaced signal values of the input signal are sampled according to various embodiments.

FIG. 10 illustrates aspects with respect to a sampling scheme 190. In FIG. 10, the valuation over time of the operation of the various sample-and-hold elements 111-113 is shown.

In the example of FIG. 10, the controller 170 is configured to activate the combination element 601 in such a manner that the capacitors 1111, 1121, 1131, 1311-1350 of the sample-and-hold elements 111-114 are charged in at least partially overlapping periods of time 702 based on the input signal 142.

From FIG. 10, it can be seen that in this example the period of time 702 between the times of successive signal values 191-193 is shorter than the conversion period 710 of the quantizer 131. By this means, a particularly short period of time 730 or a comparatively low reduction of the clock rate of the input signal 142 can be achieved. This can provide for fast analog/digital conversion. In the scenario of FIG. 10, too, averaging and thus suppression of the signal noise can be achieved due to the slightly different times associated with the time-displaced signal values.

Figure 11:
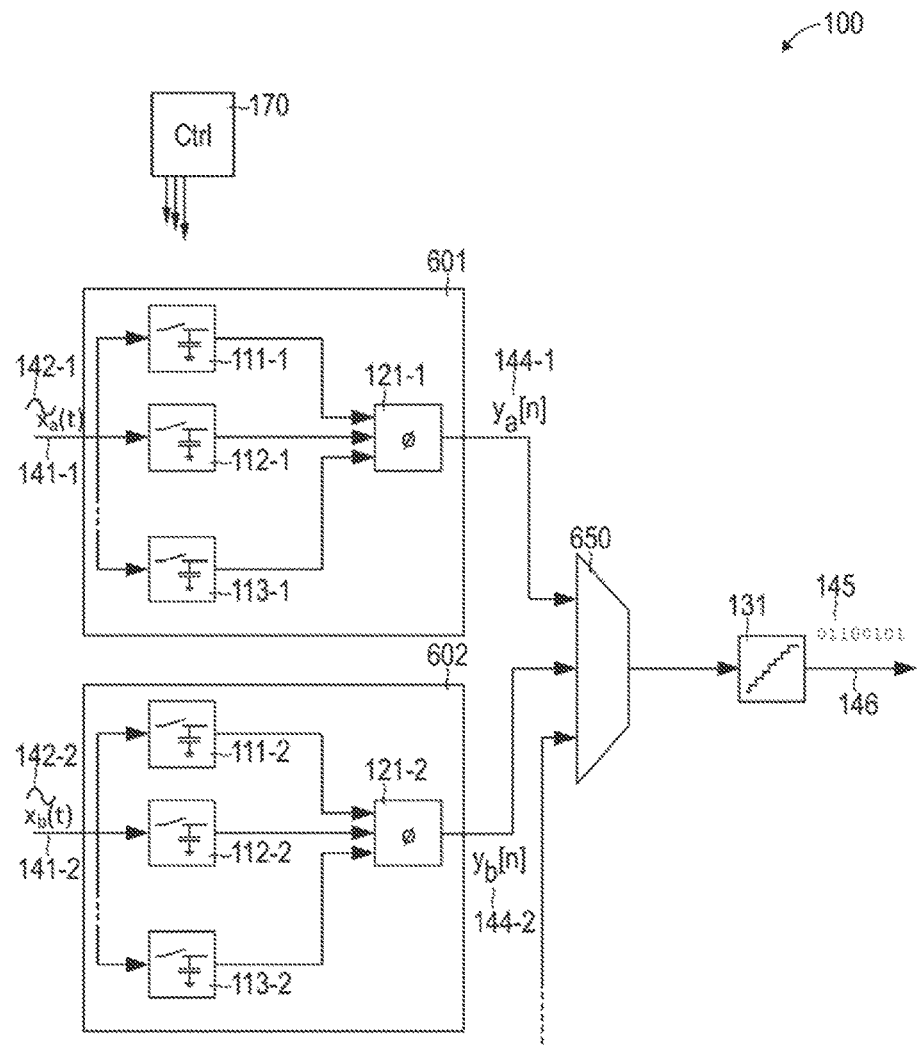
FIG. 11 diagrammatically illustrates a circuit according, to various embodiments, the circuit comprising a number of combination elements which are in each case configured to combine a number of time-displaced signal values of a corresponding input signal to form a respective analog combination signal.

FIG. 11 illustrates aspects, with respect to a circuit 100 which can perform an A/D conversion of a number of analog input signals 142-1, 142-2 which are received via different input terminals 141-1, 141-2, into a digital output signal 145 which is output via an output terminal 146. The circuit 100 thus implements an ADC.

In the example of FIG. 11, the circuit 100 comprises two input terminals 141-1, 141-2. Each input terminal 141-1, 141-2, is allocated here a combination element. 601, 602. The combination element 601 is configured to combine a number of time-displaced signal values of the input signal 162-1 to form a combination signal 144-1. The combination element 602 is configured to combine a number of time-displaced signal values of the input signal 142-2 to form an analog combination signal 144-2. For each of the combination elements 601, 602, techniques can be used here as have been described above.

The circuit 100 also comprises a multiplexer 650. The multiplexer 650 is configured to optionally transfer the combination signal 144-1 or the combination signal 144-2 to the converter core 1315 of the quantizer 131.

By means of such techniques, better utilization of the quantizer 131 can be achieved. In particular, the periods of time 720 (compare FIGS. 8-10), which are needed for sampling a respective input signal 142-1, 142-2 can be used for converting or implementing the respective other input signal 142-1, 142-2 by means of the quantizer 131 into the digital output signal 145.

However, more than two combination elements 601, 602 can also 2, be provided.

Figure 12:
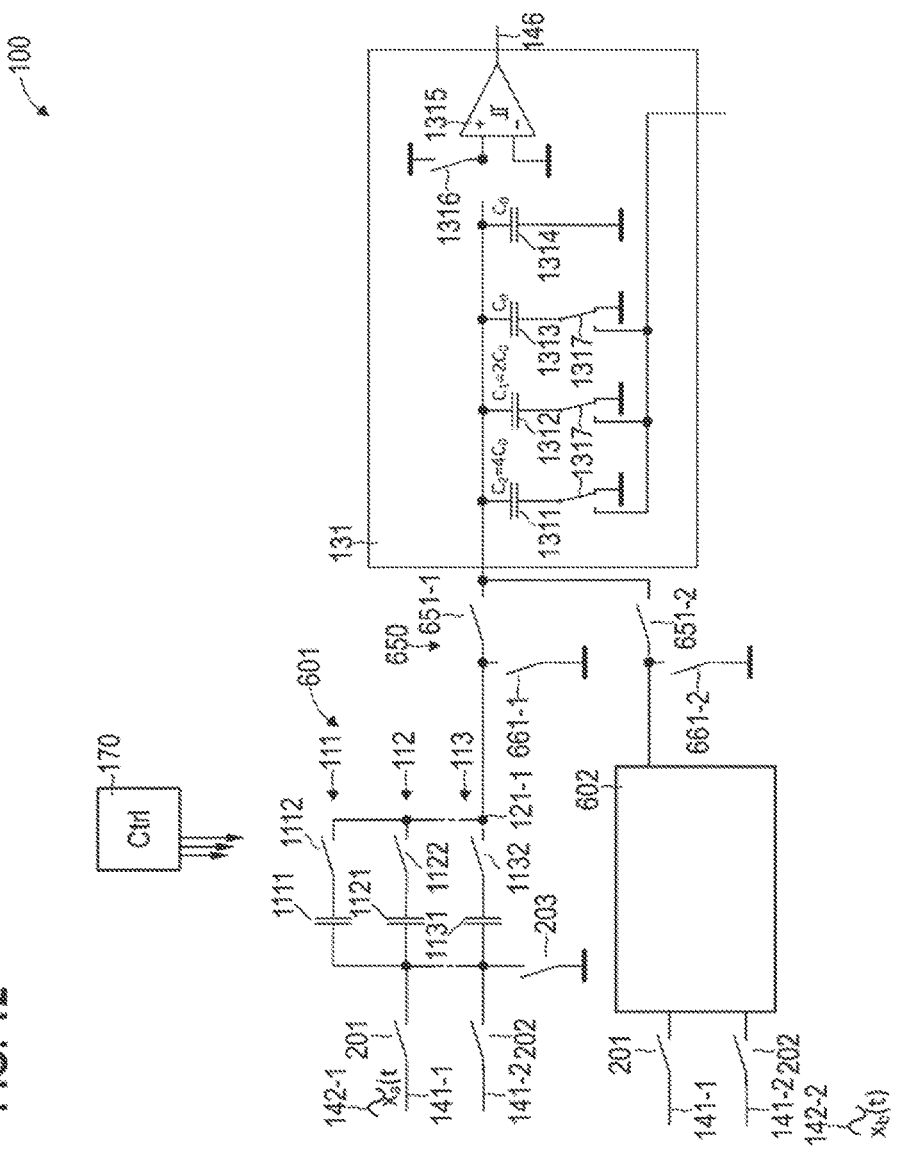
FIG. 12 diagrammatically illustrates a possible implementation of the circuit of FIG. 11 according to various embodiments.

FIG. 12 illustrates aspects with respect to the circuit 100. FIG. 12 illustrates, in particular, an exemplary hardware implementation of the circuit 100 according to FIG. 11.

The example of FIG. 12 here basically corresponds to the example of FIG. 3. In FIG. 12, there are in each case two switches 651-1, 651-2, 661-1, 661-2 for implementing the multiplexer 650. The combination element. 602 can be designed in correspondence with the combination element 601.

Figure 13:
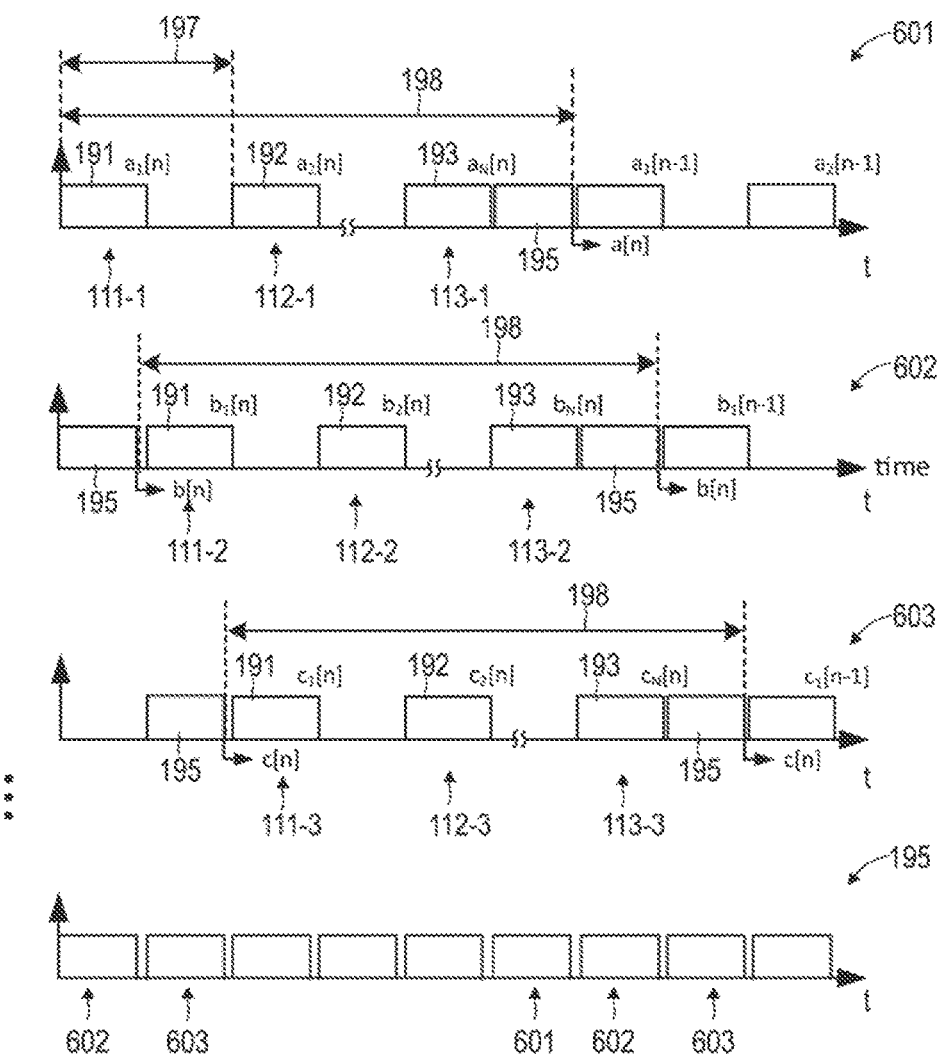
FIG. 13 diagrammatically illustrates a sampling arrangement by means of which the time-displaced signal values of the input signal are sampled in accordance with various embodiments.

FIG. 13 illustrates aspects with respect to a sampling scheme 190. FIG. 13 shows the variation over time of the operation of the various sample-and-hold elements 111-113 for a number of combination elements 601-603. E.g., the sampling scheme 190 of FIG. 13 could be applied in conjunction with the circuits 100 of FIGS. 11 and 12.

In FIG. 13, a scenario is shown in which the multiplexer 650 is configured to transfer the combination signals 144-1, 144-2 of the various combination elements 601-603 in each case in several iterations which correspond to the periods of time 198, to the converter core 1215 of the quantizer 131. In this context, the transferring of the various combination signals 144-1, 144-2 of the various combination elements 601-603 takes place interleaved in time for the several iterations. By this means, it is possible to achieve that the converting 195 by the quantizer 131 takes place in each case alternately for different combination signals 144-1, 144-2 of the various combination elements 601-603 (shown at the very bottom in FIG. 13; in these contexts, other combination elements can be provided). By this means, a particularly good capacity utilization and time efficiency of the converter core 1315 and of the quantizer 131 can be achieved.

In the example of FIG. 13, the signal values 191-193 of the input signals 142-1, 142-2 allocated to the various combination elements 601-603 are arranged interleaved in time. Since, however, the various combination elements 601-603 are arranged in parallel and essentially independently of one another, it would also be possible in other embodiments that the signal values 191-193 of the input signals 142-1, 142-2 allocated to the various combination elements 601-603 are arranged to be not interleaved in time.

In the example of FIG. the Nyquist rate for the various input signals 142-1, 142-2 is $$f_s = \frac{1}{T_{sample}},$$

wherein $T_{sample}$ designates the period of time 197 between the times of adjacent signal values 191-193. The averaging of the time-displaced signal values over the period of time 198 corresponds to a reduction of the clock rate of the respective input signal 142-1, 142-2. As a result, aliasing effects are avoided. The converter core 1315 generates for each input signal 142-1, 142-2 in each case a value of the digital output signal 145 per period of time 198. The limitation of bandwidth of the signals 142-1, 142-2 is reduced by a factor of N, e.g. in comparison with a reference implementation in which the low-pass filtering takes place in the digital domain. The reduction of the uncorrelated noise is still $\sigma^2_7/N$. Scaling with N is possible.

In summary, techniques were described above which enable A/D conversion to be performed with significant reduction of the uncorrelated signal noise of the analog input signal. In these contexts, a number of sample-and-hold elements are used, for example, which have in each case a switch and a capacitor. It can then be possible that the various sample-and-hold elements detect signal values by sampling the analog input signal at different periods of time. The capacitors of the sample-and-hold elements can subsequently be connected in parallel in order to combine the corresponding signal values and, in particular, to average them. The charge can then be propagated by all or some of the capacitors of the sample-and-hold elements to form one ADC for the conversion by passive charge redistribution.

Above, examples have also been described in which parallel and distributed sampling of the analog input signal by means of a number of combination elements is implemented. This provides for a reduction of the clock rate by which means, in turn, a bandwidth limitation of the analog input signal is provided for by which means the alias-relevant effective Nyquist frequency of the ADC is increased, in turn.

The techniques described here also enable sampling points arranged randomly in the period of time to be used. For this purpose, various techniques can be used such as, for example, random analog jitter, random delay stages, analog delay stages etc. Flexible sampling schemes can be used.

Especially in conjunction with SAR ADCs, the techniques described herein can be built up on hardware present in any case. For example, DAC capacitors of the SAP. ADC can be reused as sample-and-hold elements.

The techniques described herein can enable a highly integrated circuit to be implemented for the A/D conversion with comparatively little power consumption. In addition, a particularly fast A/D conversion can be performed, e.g. in parallelized form.

For example, it can be possible to implement a lower clock rate of the ADC in comparison with reference implementations in which filtering is performed in the digital domain. This can be the case since in typical reference implementations—as described above—a reduction of the clock rate is only performed after the ADC due to the low-pass filtering in the digital domain. According to the present techniques, the low-pass filtering and reduction of the clock rate is performed in a particularly early stage of the processing chain, namely in the analog domain, so that it is subsequently not necessary that the ADC operates with a high sampling frequency. By this means, the power consumption of the circuit, in particular, can be reduced without an accuracy of the A/D conversion having to suffer.

In various examples, it can also be possible to achieve a selectable gain factor by only partially propagating the charge of the capacitors of the sample-and-hold elements to the quantizer of the ADC.

Naturally, the features of the embodiments and aspects of the invention described above can be combined with one another. In particular, the features can be used not only in the combinations described but also in other combinations or by themselves without departing from the field of the invention.

For example, differential connections or differential input and output signals can be used instead of single-element connections.

The ground referenced above can be at different reference potentials.

In the text above, various examples have been described with reference to sample-and-hold elements which comprise a capacitor and a switch. However, it may be possible that corresponding techniques can also be implemented for other types of sample-and-hold elements.

For example, various techniques have been described above with reference to a top-plate sampling chain. In other examples, however, it would also be possible that the corresponding techniques are implemented in conjunction with a bottom-plate sampling chain. In this context, the analog input signals can be connected to one of the capacitor sides, the other one of the capacitor sides being connected with the quantizer 131.

The invention claimed is:

1. A circuit comprising:
   an input terminal configured to receive an analog input signal,
   a combination element comprising a number of sample-and-hold elements configured to sample and to hold a number of time-displaced signal values of the analog input signal at different times, wherein the combination element is configured to combine the time-displaced signal values of the analog input signal to form an analog combination signal, and
   a quantizer having a converter core configured to receive the analog combination signal via passive charge redistribution from the combination element and to convert it into a digital output signal.

2. The circuit of claim 1,
   wherein the sample-and-hold elements comprise at least one switch and in each case one capacitor,
   wherein the circuit also comprises at least one controller configured to combine the time-displaced signal values of the analog input signal by time-overlapping operation of the switches and for passive charge redistribution between the capacitors.

3. The circuit of claim 2, wherein the at least one controller is also configured to transfer a fraction of the charge of all capacitors in accordance with a subset of the sample-and-hold elements as the analog combination signal to the converter core.

4. The circuit of claim 3, wherein the at least one controller is configured to determine the subset in dependence on a selectable gain factor.

5. The circuit of claim 2, wherein the capacitors of the sample-and-hold elements have different or identical capacitances.

6. The circuit of claim 2, wherein the capacitors of the sample-and-hold elements are formed by a sampling capacitor of the quantizer.

7. A circuit comprising:
   an input terminal configured to receive an analog input signal,
   a combination element configured to combine a number of time-displaced signal values of the analog input signal to form an analog combination signal, and
   a quantizer configured to convert the analog combination signal according to the successive approximation register method, wherein the quantizer comprises:
      a converter core configured to receive the analog combination signal via passive charge redistribution from the combination element and to convert it into a digital output signal, and
      a parallel connection of a number of digital-to-analog converter (DAC) capacitors as an input stage to a comparator forming the converter core.

8. The circuit of claim 7,
   wherein the combination element comprises a number of sample-and-hold elements configured to sample and to hold the time-displaced signal values of the analog input signal at different times, and
   wherein the capacitors of the sample-and-hold elements are formed by the DAC capacitors.

9. The circuit of claim 8, wherein the switches of the sample-and-hold elements are arranged in a signal path from the input terminal to the converter core and between adjacent capacitors.

10. The circuit of claim 8, wherein the switches of the sample-and-hold elements connect the respective capacitor optionally to ground, a reference potential and a floating potential.

11. The circuit of claim 1, further comprising at least one controller configured to activate the combination element in such a manner that the time-displaced signal values are arranged at random times.

12. The circuit of claim 1, further comprising at least one controller configured to activate the combination element in such a manner that the time-displaced signal values are arranged at times which have a distance from one another which is shorter than a conversion period of the quantizer for converting the analog combination signal into the digital output signal.

13. The circuit of claim 1, further comprising at least one controller configured to activate the combination element in such a manner that a period between a time corresponding to a first signal value and a time corresponding to a last signal value is shorter than a conversion period of the quantizer for converting the analog combination signal into the digital output signal.

14. The circuit of claim 2, wherein the at least one controller is configured to activate the combination element in such a manner that the capacitors of the sample-and-hold elements are charged in at least partially overlapping periods based on the analog input signal.

15. The circuit of claim 1, further comprising:
   a further input terminal configured to receive a further analog input signal,
   a further combination element configured to combine a number of time-displaced signal values of the further analog input signal to form a further analog combination signal, and
   a multiplexer configured to transfer optionally the analog combination signal or the further analog combination signal to the converter core of the quantizer.

16. The circuit of claim 15, further comprising at least one controller configured to activate the combination element and the further combination element in such a manner that the time-displaced signal values of the analog input signal and the time-displaced signal values of the further analog input signal are interleaved in time.

17. The circuit of claim 15,
   wherein the multiplexer is configured to transfer the analog combination signal and the further analog combination signal in each case in a number of iterations to the converter core of the quantizer, and
   wherein the transferring of the analog combination signal and the transferring of the further analog combination signal is interleaved in time over a number of iterations.

18. The circuit of claim 1, wherein the sample-and-hold elements branch from the path from the input terminal to the quantizer.

19. The circuit of claim 1, wherein the quantizer is configured to convert the analog combination signal in accordance with the sigma-delta method.

20. A method comprising:
   receiving an analog input signal, sampling and holding a number of time-displaced signal values of the analog input signal at different times, combining the time-displaced signal values of the analog input signal to obtain an analog combination signal, transferring the analog combination signal via passive charge redistribution, and converting the analog combination signal into a digital output signal.

21. The circuit of claim 7, further comprising at least one controller configured to activate the combination element in such a manner that the time-displaced signal values are arranged at random times.

22. The circuit of claim 7, further comprising at least one controller configured to activate the combination element in such a manner that a period between a time corresponding to a first signal value and a time corresponding to a last signal value is shorter than a conversion period of the quantizer for converting the analog combination signal into the digital output signal.

* * * * *